United States Patent
Fang et al.

(10) Patent No.: US 12,482,914 B2
(45) Date of Patent: Nov. 25, 2025

(54) DIGITAL ISOLATOR AND DIGITAL SIGNAL TRANSMISSION METHOD THEREOF

(71) Applicant: Silergy Semiconductor Technology (Hangzhou) LTD, Hangzhou (CN)

(72) Inventors: Chiqing Fang, Hangzhou (CN); Wei Chen, Hangzhou (CN); Yufei Dong, Hangzhou (CN); Xiaodong Huang, Hangzhou (CN); Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 385 days.

(21) Appl. No.: 18/072,851

(22) Filed: Dec. 1, 2022

(65) Prior Publication Data

US 2023/0178869 A1 Jun. 8, 2023

(30) Foreign Application Priority Data

Dec. 2, 2021 (CN) .......................... 202111473956.X

(51) Int. Cl.
 *H01P 1/36* (2006.01)
 *H03M 5/16* (2006.01)
(52) U.S. Cl.
 CPC ................ *H01P 1/36* (2013.01); *H03M 5/16* (2013.01)

(58) Field of Classification Search
 CPC .................................. H01P 1/36; H03M 5/16
 See application file for complete search history.

(56) References Cited

U.S. PATENT DOCUMENTS

| | | | |
|---|---|---|---|
| 8,847,503 B2 | 9/2014 | Chang et al. | |
| 9,673,721 B2 | 6/2017 | Trescases et al. | |
| 9,973,220 B2 | 5/2018 | Kramer et al. | |
| 10,038,403 B2 | 7/2018 | Kamath et al. | |
| 2016/0277048 A1* | 9/2016 | Kramer | H03F 1/02 |

FOREIGN PATENT DOCUMENTS

CN 112383297 A 2/2021

\* cited by examiner

*Primary Examiner* — Rahel Guarino

(57) ABSTRACT

A digital isolator can include: an encoding circuit configured to receive an input digital signal, and to encode a rising edge and a falling edge of the input digital signal into different coded signals; an isolating element coupled to encoding circuit, and being configured to transmit the coded signal in an electrical isolation manner; and a decoding circuit configured to receive the coded signal through the isolation element, and to decode the coded signal to obtain the rising edge and the falling edge, in order to output an output digital signal consistent with the input digital signal, where the rising edge of the input digital signal is encoded as a first pulse sequence, and the falling edge of the input digital signal is encoded as a second pulse sequence different from the first pulse sequence.

18 Claims, 10 Drawing Sheets

DIGITAL ISOLATOR AND DIGITAL SIGNAL TRANSMISSION METHOD THEREOF

RELATED APPLICATIONS

This application claims the benefit of Chinese Patent Application No. 202111473956.X, filed on Dec. 2, 2021, which is incorporated herein by reference in its entirety.

FIELD OF THE INVENTION

The present invention generally relates to the field of power electronics, and more particularly to digital isolators and associated digital signal transmission methods.

BACKGROUND

In an electronic system, a digital isolator is a device that has a high resistance isolation characteristic when a digital signal and an analog signal are transmitted, in order to realize isolation between an electronic system and the user. Circuit designers typically introduce isolation to meet safety requirements, or to reduce the noise of the grounding loop. Current isolation can ensure that data transmission is not through electrical connection or a leakage path, thereby avoiding security risks.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
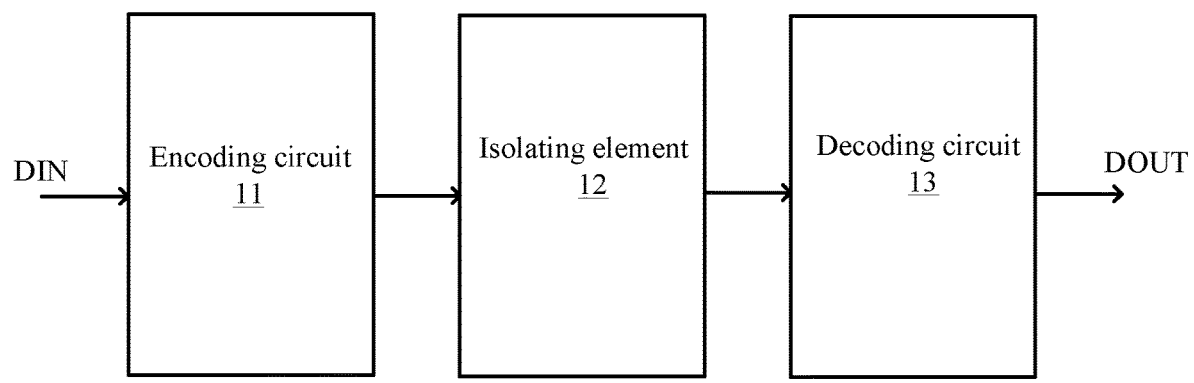
FIG. 1 is a schematic block diagram of a digital isolator, in accordance with an embodiment of the present invention.

Referring now to FIG. 1, shown is a schematic block diagram of a digital isolator, in accordance with an embodiment of the present invention. In this particular example, digital isolator 1 can include encoding circuit 11, isolating element 12, and decoding circuit 13. Encoding circuit 11 can couple decoding circuit 13 through isolation element 12, in order to realize transmission of the input digital signal as input to the output terminal of the digital isolator by electrical isolation. Coding circuit 11 may receive an input digital signal, and can encode a rising edge and a falling edge of the input digital signal into different coded signals. Isolation element 12 can be a capacitor or a transformer for transmitting the coded signal in an electrical isolation manner. Decoding circuit 13 can connect to isolation element 12, and may receive the coded signal to decode to obtain the rising edge and the falling edge, in order to restore the input digital signal.

In particular embodiments, encoding circuit 11 can encode the rising edge of input digital signal DIN as a first pulse sequence, and the falling edge of input digital signal DIN as a different second pulse sequence. Because the two pulse sequences are different, and isolation element 12 can transmit pulse sequences in electrical isolation (e.g., the input and output terminals of the digital isolator are not grounded), here isolation element 12 can be a capacitor or a transformer. Thus, the pulse sequences (e.g., the coded signals for the rising edge position and the falling edge position) can be transmitted to decoding circuit 13. Decoding circuit 13 may output a rising edge transition after detecting the first pulse sequence, and may output a falling edge transition after detecting the second pulse sequence. Therefore, output digital signal DOUT that is consistent with input digital signal DIN can be effectively output.

In particular embodiments, the first pulse sequence and the second pulse sequence can include a different number of pulse groups, whereby each pulse group has the same mode, and the pulse group can include at least two pulses. In another example, the first pulse sequence and the second pulse sequence can include pulse groups with different modes, and the pulse properties or repetition modes of the pulse groups with different modes are different. In this example, encoding circuit 11 and decoding circuit 13 can be formed by an edge detection circuit, a signal modulator, and a carrier generator. The output of the coding circuit 11 can be a single pulse signal or a dual differential signal, whereby a dual differential signal can further enhance the anti-interference ability. In addition, when a single pulse signal is used as the coded signal, one isolation element can be used. When the dual differential signal is used as coded signal(s), two isolation elements may be utilized.

Figure 2:
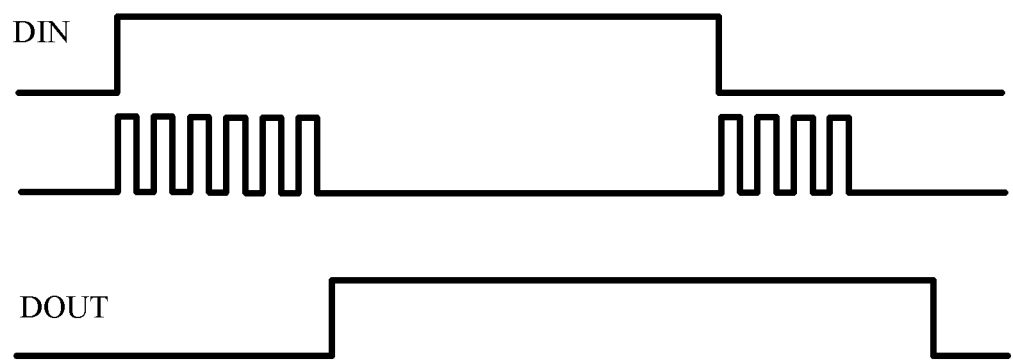
FIG. 2 is a waveform diagram of example operation of a digital isolator.

Referring now to FIG. 2, shown is a waveform diagram of example operation of a digital isolator. In this particular example, in the digital isolator, the rising edge can correspond to 6 consecutive pulses, and the falling edge can correspond to 4 consecutive pulses. Therefore, at the decoding end, the rising edge and the falling edge can be identified by counting the number of continuous pulses in a predetermined period. However, the digital isolator using this coding method may have relatively poor anti-interference ability. If electromagnetic interference occurs during transmission, possibly resulting in a change in the number of continuous pulses, this may lead to decoding errors at the decoder.

Figure 3:
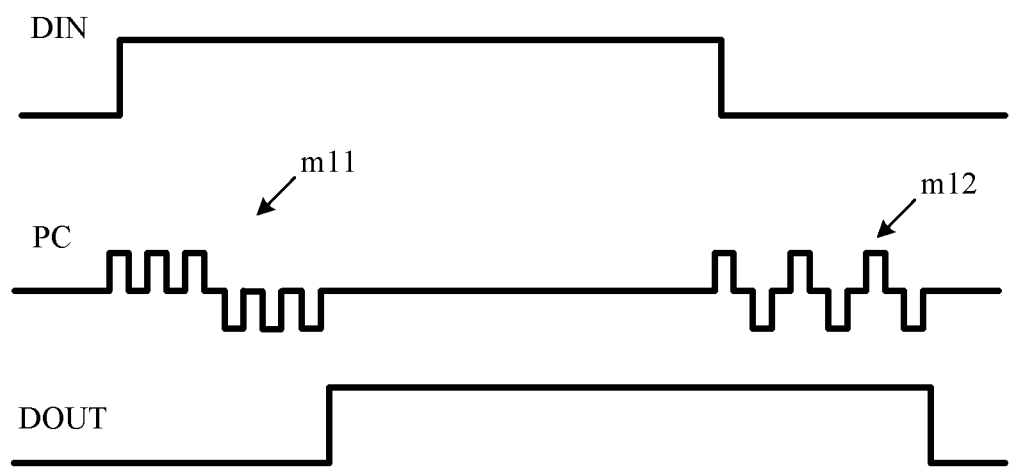
FIG. 3 is a waveform diagram of first example operation of a digital isolator, in accordance with an embodiment of the present invention.

Referring now to FIG. 3, shown is a waveform diagram of first example operation of a digital isolator, in accordance with an embodiment of the present invention. In this particular example, first pulse sequence m11 corresponding to the rising edge of input digital signal DIN can include three positive pulses and three negative pulses, in which the positive pulses are arranged continuously and the negative pulses are also arranged continuously. Second pulse sequence m12 corresponding to the falling edge of input digital signal DIN can include three positive pulses and three negative pulses, in which the positive pulses and negative pulses are arranged in intervals. Coding circuit 11 can output first pulse sequence m11 after detecting the rising edge transition of input digital signal DIN, and may output second pulse sequence m12 after detecting the falling edge transition of input digital signal DIN. The output signal of coding circuit 11 is coded signal PC.

Decoding circuit 13 may receive coded signal PC through isolation element 12, can output the rising edge at the output terminal after detecting first pulse sequence m11 in coded signal PC, and may output the falling edge at the output terminal after detecting second pulse sequence m12 in coded signal PC. Further, decoding circuit 13 can record 1 when the positive pulse is detected and record 0 when the negative pulse is detected, such that a binary number sequence can be obtained, and then the binary number sequence can be identified. In this way, decoding circuit 13 can correctly identify the binary number sequence as first pulse sequence m11 or second pulse sequence m12. Because two different pulses are used to form the pulse sequence, the sequence of coded signals used to characterize the rising edge and the falling edge is more easily identified. Further, since the above pulse sequence can be decoded into the binary number by the decoding circuit, by adding repetitive information or error correction information (e.g., adding one or more pulses as a check bit), the fault tolerance of the coded signal can be greatly enhanced. When an error pulse occurs in the pulse sequence due to external interference, the pulse sequence corresponding to the rising edge and the falling edge can still be correctly identified, thereby improving the anti-interference ability.

Figure 4:
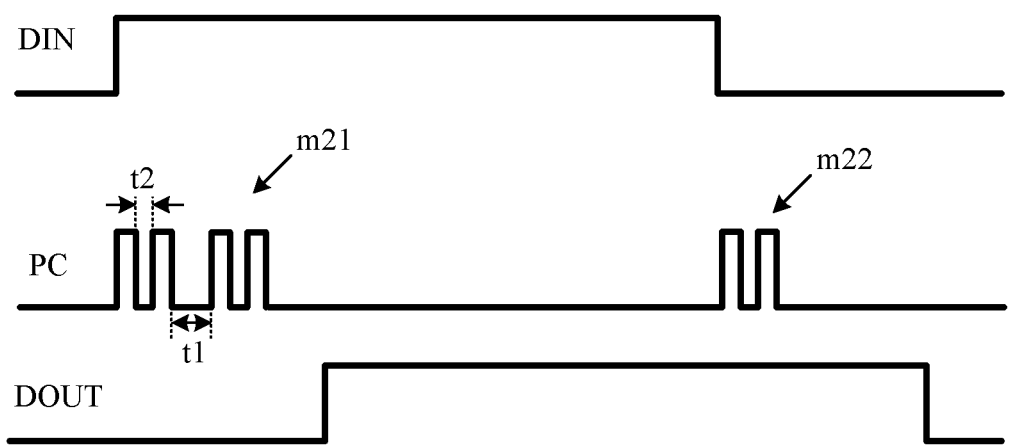
FIG. 4 is a waveform diagram of second example operation of a digital isolator, in accordance with an embodiment of the present invention.

Referring now to FIG. 4, shown is a waveform diagram of second example operation of a digital isolator, in accordance with an embodiment of the present invention. In this particular example, first pulse sequence m21 corresponding to the rising edge of the input digital signal and second pulse sequence m22 corresponding to the falling edge may have the same mode and different number of pulse groups. For example, first pulse sequence m21 can include two pulse groups, whereby the two pulse groups are separated by a long first interval t1, and each pulse group has the same mode. That is, two positive pulses in each pulse group can be separated by second time interval t2 and have the same width (e.g., the length of time maintained at a high level). In addition, second pulse sequence m22 can include one pulse group, which is the same as the pulse group in the first pulse sequence, and can also include two positive pulses with periodic arrangement and the same width.

It should be understood that the number of pulse groups is not limited to 2, can be more than 2, and the number of pulses in the pulse group is not limited to two, can be more than 2. The number of pulse groups and the number and type of pulses in the pulse group can be set according to particular requirements. If the setting is increasingly complex, the complexity of the circuit correspondingly increases, and the delay may increase, and the anti-interference can be improved. The interval between adjacent pulse groups may be one or more complete pulse periods. Since the pulse group can include multiple pulses, different pulse groups can be distinguished by different time intervals within the pulse group. Therefore, for decoding circuit 13, the difficulty of distinguishing the first pulse sequence corresponding to the rising edge and the second pulse sequence corresponding to the falling edge may be reduced, which can effectively improve the anti-interference performance.

Figure 5:
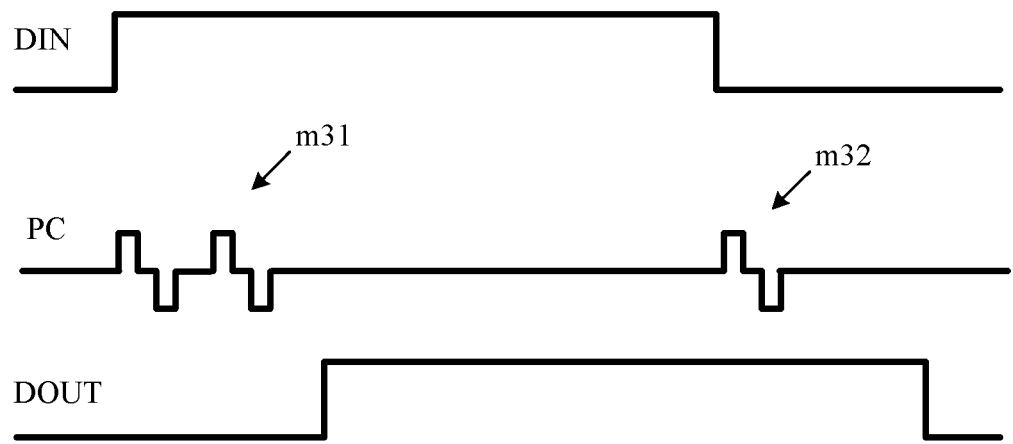
FIG. 5 is a waveform diagram of third example operation of a digital isolator, in accordance with an embodiment of the present invention.

Referring now to FIG. 5, shown is a waveform diagram of third example operation of a digital isolator, in accordance with an embodiment of the present invention. For example, first pulse sequence m31 and second pulse sequence 32 may have different numbers of pulse groups, and the number of the pulses of each pulse group, and the mode of each pulse group are the same. In this particular example, the pulse groups may longer be distinguished by the time interval different from the group, but by the composition mode of the pulse group itself. Each pulse group may have one positive pulse and one negative pulse. Optionally, the pulse group can also have more than two positive pulses, or more than two negative pulses.

In addition, the time intervals between each pulse and between pulse groups can be the same. Due to the introduction of negative pulses, the pulse group may be identified by the pulse distribution pattern within the pulse group (e.g., the arrangement of positive pulses and negative pulses), and then the pulse group can be counted. Therefore, the first pulse sequence corresponding to the rising edge and the second pulse sequence corresponding to the falling edge can be more effectively distinguished to improve the anti-interference performance. It should be understood that in other examples, the composition mode of the pulse group (e.g., the distribution mode of positive and negative pulses) and the different time intervals used in the pulse group can be used synchronously to distinguish the pulse group in the pulse sequence.

Figure 6:
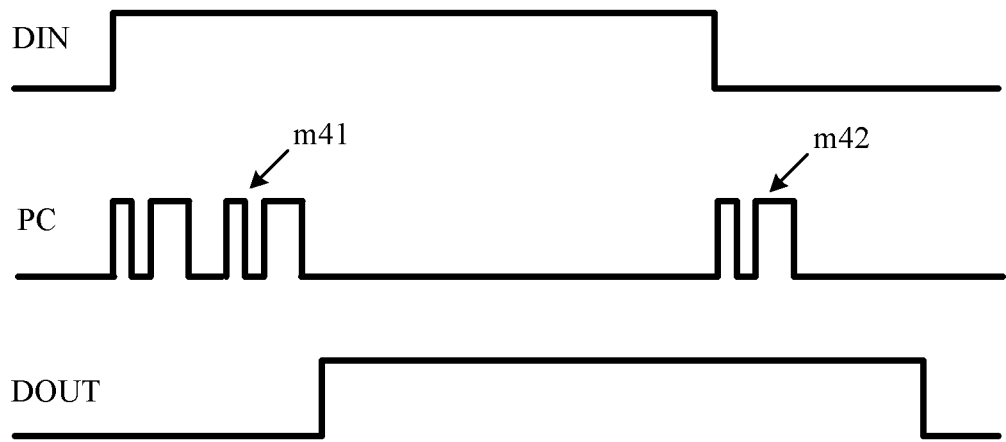
FIG. 6 is a waveform diagram of fourth example operation of a digital isolator, in accordance with an embodiment of the present invention.

Referring now to FIG. 6, shown is a waveform diagram of fourth example operation of a digital isolator, in accordance with an embodiment of the present invention. The pulse group in this example has multiple positive pulses with different widths, and the pulse group can be identified by the distribution arrangement of the pulses with different widths. In this particular example, first pulse sequence m41 can include two pulse groups, each of which can include two pulses with different widths. Second pulse sequence 42 may have a pulse group formed in the same way as the pulse group in first pulse sequence m41. Similar to negative pulses, positive pulses of different widths can also enable decoding circuit 13 to effectively identify and distinguish pulse groups according to the arrangement of pulses of different properties, thereby accurately counting the pulse groups to identify the pulse sequences corresponding to the rising and falling edges of the input digital signal.

Figure 7:
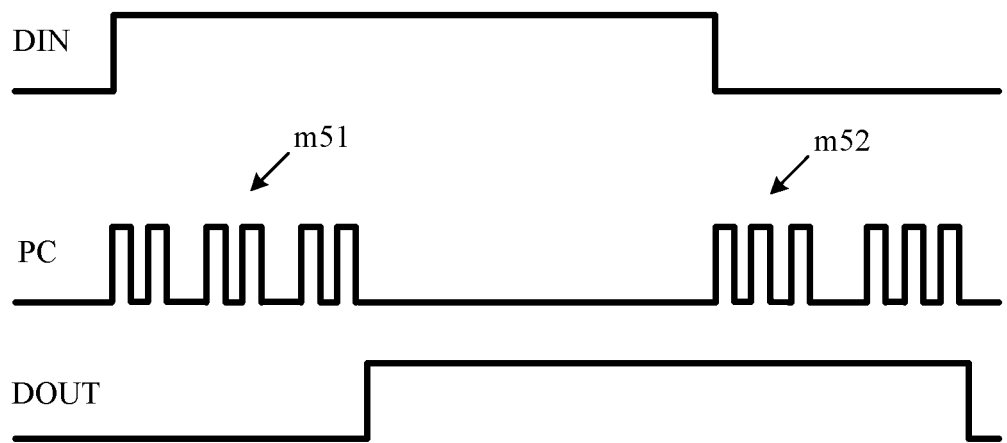
FIG. 7 a waveform diagram of fifth example operation of a digital isolator, in accordance with an embodiment of the present invention.

Referring now to FIG. 7, shown is a waveform diagram of fifth example operation of a digital isolator, in accordance with an embodiment of the present invention. In this particular example, the pulse groups in the first pulse sequence and the second pulse sequence have different modes, and the pulse sequence corresponding to the rising edge or the falling edge of the received pulse sequence can be identified by identifying the pulse groups with different modes. For example, first pulse sequence m51 may have three pulse groups, each of which has two identical positive pulses, with the intervals between the different pulses in the pulse group being the first interval, and the different pulse groups being separated by a longer second interval.

Second pulse sequence m52 may have two pulse groups, and each pulse group three identical pulses. The interval between different pulses in the pulse group is the first interval, and different pulse groups are separated by a longer second interval. That is, the number of pulses of the first pulse sequence is different from that of the second pulse sequence. Thus, decoding circuit 13 can distinguish between different pulse sequences by the interval and the number of pulses in the pulse group. Since the first pulse sequence and the second pulse sequence can be distinguished by double information, the anti-interference ability of the digital isolator can be increased. Furthermore, the positive pulse in this example can also be replaced by negative pulse.

Figure 8:
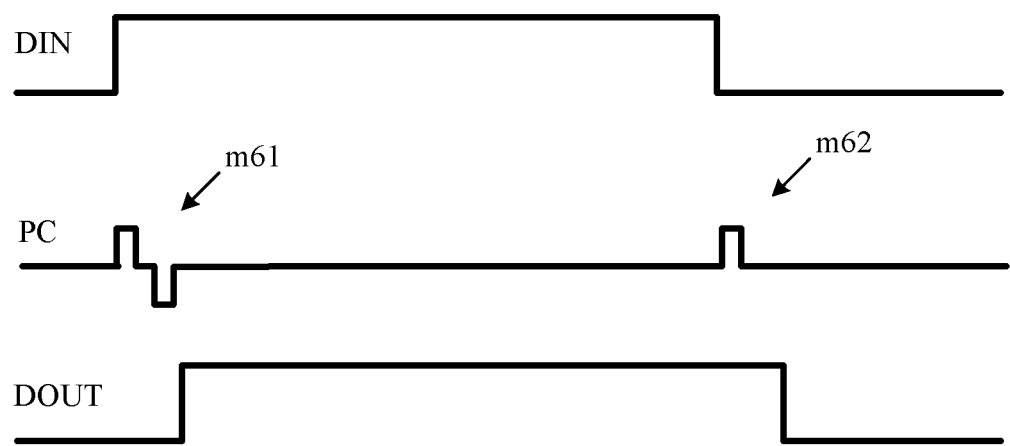
FIG. 8 a waveform diagram of sixth example operation of a digital isolator, in accordance with an embodiment of the present invention.

Referring now to FIG. 8, shown is a waveform diagram of sixth example operation of a digital isolator, in accordance with an embodiment of the present invention. For example, the pulse groups in the first pulse sequence and the second pulse sequence have different modes, and the pulse sequence corresponding to the rising edge or the falling edge of the received pulse sequence is identified by identifying the pulse groups with different modes. Here, a negative pulse is introduced. In this particular example, first pulse sequence m61 can include a pulse group consisting of a positive pulse and a negative pulse. Second pulse sequence m62 may also have a pulse group, which is different from the pulse group of first pulse sequence m61 and has only one positive pulse. Therefore, the pulse group can be formed by introducing positive pulse and negative pulse, and the first pulse sequence corresponding to the rising edge and the second pulse sequence corresponding to the falling edge may be distinguished by the pulse groups in different modes with combination of the number of pulse groups. This can improve the discrimination of different pulse sequences and improve the anti-interference ability. Alternatively, each pulse group may have multiple positive pulses and multiple negative pulses, and the first and second pulse sequences may have the same or different number of pulse groups.

Figure 9:
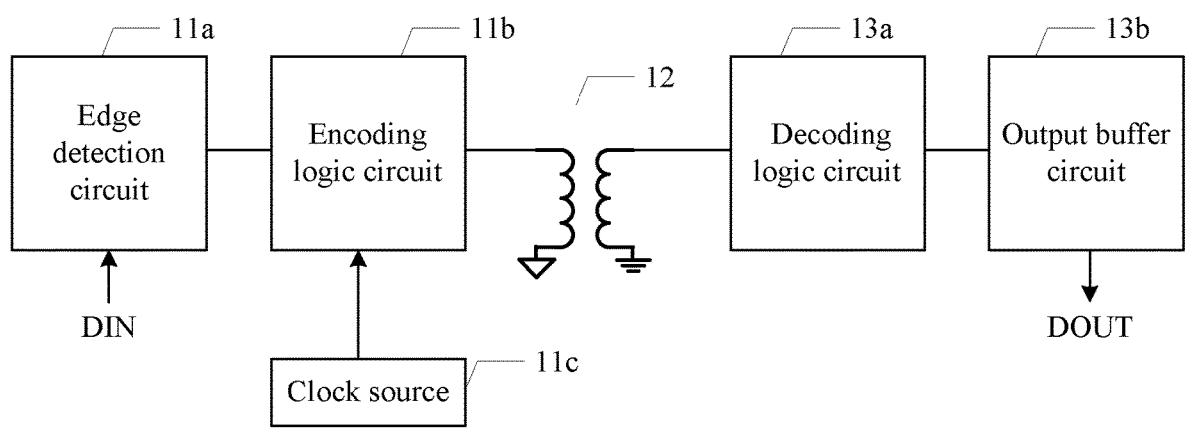
FIG. 9 is a schematic block diagram of a second example digital isolator, in accordance with an embodiment of the present invention.

Referring now to FIG. 9, shown is a schematic block diagram of a second example digital isolator, in accordance with an embodiment of the present invention. In this particular example, encoding circuit 11 can include edge detection circuit 11a, encoding logic circuit 11b, and clock source 11c. Edge detection circuit 11a may receive the input digital signal, detect a transition (e.g., a rising edge or a falling edge) in the input digital signal, and output the corresponding detection trigger signal, in order to indicate the position of the rising edge or the falling edge. Coding logic circuit 11b can connect between clock source 11c and edge detection circuit 11a. Coding logic circuit 11b may obtain the high-frequency clock signal from clock source 11c. After receiving the detection trigger signal (e.g., after edge detection circuit 11a detects the transition), the corresponding coded signal can be output to isolation device 12 according to the frequency of the clock signal.

In this example, isolation device 12 can include a transformer, and may adopt a single transmission mode; that is, one terminal of the transformer can be grounded. Decoding circuit 13 can include decoding logic circuit 13a and output buffer circuit 13b. Decoding logic circuit 13a can decode the encoded signal transmitted through the transformer, and may determine whether the pulse is detected by the edge detection. When the first pulse sequence is detected, the rising edge signal can be output through output buffer circuit 13c. when the second pulse sequence is detected, the falling edge signal may be output through output buffer circuit 13c. For example, the clock source can be realized by a crystal oscillator circuit and frequency division circuit. Coding logic circuit 11b and decoding logic circuit 11c, and edge detection circuit 11a and output buffer circuit 13c can be realized by the combination of the basic logic gate circuits, or other suitable digital signal processing circuits.

In this example, the rising edge and falling edge of the input digital signal can be redundantly coded by the encoder, and the rising edge and falling edge maybe characterized by a pulse sequence including different numbers of pulse groups of the same mode, or pulse groups of different modes. Since more information is added to the coding information, the rising edge and falling edge information can be accurately transmitted through the isolation element, in order to improve the anti-interference performance.

Figure 10:
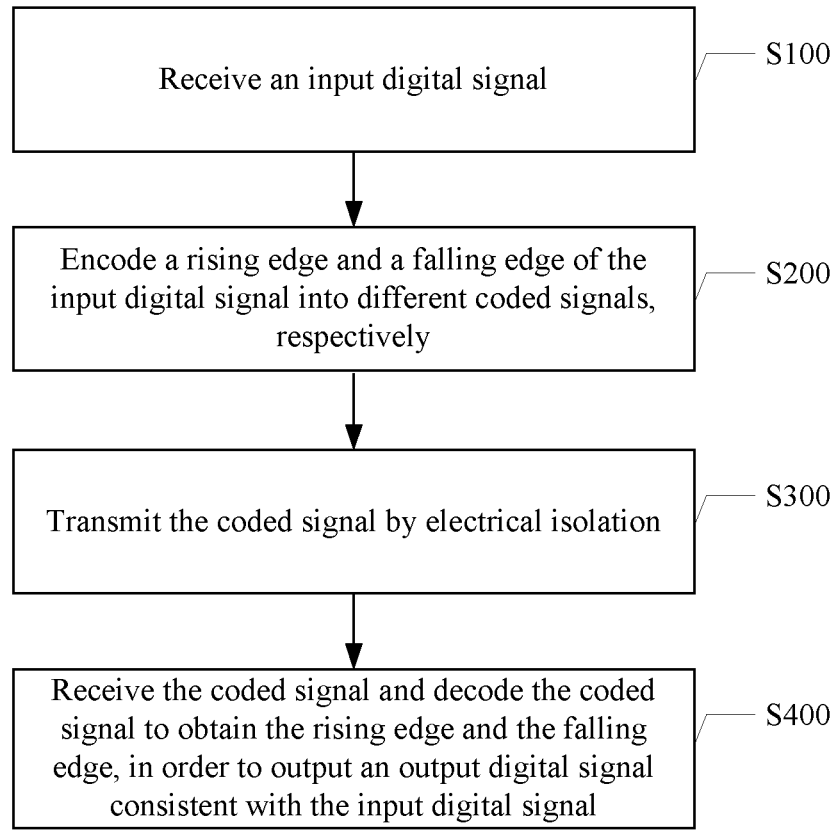
FIG. 10 is a flow diagram of an example digital signal transmission method, in accordance with embodiments of the preset invention.

Referring now to FIG. 10, shown is a flow diagram of an example digital signal transmission method, in accordance with embodiments of the preset invention. This example digital signal transmission method can be applied to the digital isolator. In this particular example, the digital signal transmission method can include the following steps. At S100, an input digital signal being received. At S200, the rising edge and falling edge of the input digital signal can be respectively encoded into different coded signals. At S300, the coded signal may be transmitted by electrical isolation. At S400, the coded signal can be received and decoded to output the rising and falling edges, in order to obtain an output digital signal consistent with the input digital signal.

In this embodiment, the first pulse sequence and the second pulse sequence can include different number of pulse groups, each pulse group may have the same mode, and the pulse group can include at least two pulses. In another example, the first pulse sequence and the second pulse sequence can include pulse groups with different modes, and the pulse properties or repetition modes in the pulse groups with different modes are different. Further, S200 can include beginning to output the coded signal after detecting the rising edge or falling edge, and S400 can include controlling to output the rising edge after detecting a first pulse sequence, and to output the falling edge after detecting a second pulse sequence.

In addition, the first pulse sequence can include N positive pulses and M negative pulses arranged in a first manner, and the second pulse sequence can include N positive pulses and M negative pulses arranged in a second manner, whereby N and M are positive integers greater than 1. Further, the pulse groups in the first pulse sequence and in the second pulse sequence may have the same mode. In an optional example, the pulse group may have multiple positive pulses of the same width, and the time interval between the pulse groups may differ from the time interval between different pulses within the pulse group. In another example, the pulse group may have at least one positive pulse and at least one negative pulse. In yet another example, the pulse group may have multiple positive pulses of different widths.

Optionally, the pulse groups in the first pulse sequence and in the second pulse sequence may have different modes. In one example, the pulse group may have different numbers of positive pulses and/or different numbers of negative pulses. In another example, the pulse width or pulse interval of the pulse group may be different. Particular embodiments may provide redundancy encoding of the rising edge and falling edge of the input digital signally by the encoder, and can characterize the rising edge and falling edge by the pulse sequence that include different numbers of the pulse groups with the same mode, or the pulse groups with different modes. Because more information is added to the coding information, the rising edge and falling edge information can be accurately transmitted through the isolator, in order to improve the anti-interference performance.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A digital isolator, comprising:
   a) an encoding circuit configured to receive an input digital signal, and to encode a rising edge and a falling edge of the input digital signal into different coded signals;
   b) an isolating element coupled to the encoding circuit, and being configured to transmit the coded signals in an electrical isolation manner; and
   c) a decoding circuit configured to receive the coded signal through the isolation element, and to decode the coded signal to obtain the rising edge and the falling edge, in order to output an output digital signal consistent with the input digital signal,
   d) wherein the rising edge of the input digital signal is encoded as a first pulse sequence, and the falling edge of the input digital signal is encoded as a second pulse sequence different from the first pulse sequence, and
   e) wherein the encoding circuit is configured to output each of the coded signals after detecting the rising edge and the falling edge, and the encoding circuit is configured to output the rising edge after detecting the first pulse sequence and to output the falling edge after detecting the second pulse sequence.

2. The digital isolator of claim 1, wherein the first pulse sequence comprises N positive pulses and M negative pulses arranged in a first manner, and the second pulse sequence comprises N positive pulses and M negative pulses arranged in a second manner, wherein N and M are positive integers greater than 1.

3. The digital isolator of claim 1, wherein pulse groups in the first pulse sequence and in the second pulse sequence have a same mode, and the pulse group has multiple positive pulses of a same width, and a time interval between the pulse groups differs from a time interval between different pulses within the pulse group.

4. The digital isolator of claim 1, wherein pulse groups in the first pulse sequence and in the second pulse sequence have a same mode, and the pulse group has at least one positive pulse and at least one negative pulse.

5. The digital isolator of claim 1, wherein pulse groups in the first pulse sequence and in the second pulse sequence have a same mode, and the pulse group has multiple positive pulses of different widths.

6. The digital isolator of claim 1, wherein pulse groups in the first pulse sequence and in the second pulse sequence have different modes, and the pulse group has different numbers of positive pulses and/or different numbers of negative pulses.

7. The digital isolator of claim 1, wherein pulse groups in the first pulse sequence and in the second pulse sequence have different modes, and the pulse group has different numbers of positive pulses and/or a pulse width or a pulse interval of the pulse group is different.

8. The digital isolator of claim 1, wherein the first pulse sequence and the second pulse sequence comprise different number of pulse groups, each pulse group has a same mode, and the pulse group comprises at least two pulses.

9. The digital isolator of claim 1, wherein the first pulse sequence and the second pulse sequence comprise pulse groups with different modes, and the pulse properties or repetition modes of the pulse groups with different modes are different.

10. A method of digital signal transmission, the method comprising:
    a) receiving an input digital signal;
    b) encoding a rising edge and a falling edge of the input digital signal into different coded signals, respectively;
    c) transmitting the coded signals by electrical isolation; and
    d) receiving the coded signal and decoding the coded signal to obtain the rising edge and the falling edge, in order to output an output digital signal consistent with the input digital signal,
    e) wherein the rising edge of the input digital signal is encoded as a first pulse sequence, and the falling edge of the input digital signal is encoded as a second pulse sequence different from the first pulse sequence, and
    f) wherein encoding the rising edge and the falling edge of the input digital signal into different coded signals comprises outputting each of the coded signals after detecting the rising edge and the falling edge, wherein the encoding circuit is configured to output the rising edge after detecting the first pulse sequence and output the falling edge after detecting the second pulse sequence.

11. The method of claim 10, wherein the first pulse sequence comprises N positive pulses and M negative pulses arranged in a first manner, and the second pulse sequence comprises N positive pulses and M negative pulses arranged in a second manner, wherein N and M are positive integers greater than 1.

12. The method of claim 10, wherein pulse groups in the first pulse sequence and in the second pulse sequence have a same mode, and the pulse group has multiple positive pulses of a same width, and a time interval between the pulse groups differs from a time interval between different pulses within the pulse group.

13. The method of claim 10, wherein pulse groups in the first pulse sequence and in the second pulse sequence have a same mode, and the pulse group has at least one positive pulse and at least one negative pulse.

14. The method of claim 10, wherein pulse groups in the first pulse sequence and in the second pulse sequence have a same mode, and the pulse group has multiple positive pulses of different widths.

15. The method of claim 10, wherein pulse groups in the first pulse sequence and in the second pulse sequence have different modes, and the pulse group has different numbers of positive pulses and/or different numbers of negative pulses.

16. The method of claim 10, wherein pulse groups in the first pulse sequence and in the second pulse sequence have different modes, and the pulse group has different numbers of positive pulses and/or a pulse width or a pulse interval of the pulse group is different.

17. The method of claim 10, wherein the first pulse sequence and the second pulse sequence comprise different number of pulse groups, each pulse group has a same mode, and the pulse group comprises at least two pulses.

18. The method of claim 10, wherein the first pulse sequence and the second pulse sequence comprise pulse groups with different modes, and the pulse properties or repetition modes of the pulse groups with different modes are different.

\* \* \* \* \*